United States Patent
Xia

(10) Patent No.: US 10,636,654 B2
(45) Date of Patent: Apr. 28, 2020

(54) WAFER-SCALE SYNTHESIS OF LARGE-AREA BLACK PHOSPHORUS MATERIAL HETEROSTRUCTURES

(71) Applicant: Yale University, New Haven, CT (US)

(72) Inventor: Fengnian Xia, Orange, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/947,202

(22) Filed: Apr. 6, 2018

(65) Prior Publication Data

US 2018/0294156 A1    Oct. 11, 2018

Related U.S. Application Data

(60) Provisional application No. 62/482,333, filed on Apr. 6, 2017.

(51) Int. Cl.

| | |
|---|---|
| *H01L 21/02* | (2006.01) |
| *C01B 25/00* | (2006.01) |
| *C01B 25/023* | (2006.01) |
| *H01L 29/786* | (2006.01) |
| *H01L 23/31* | (2006.01) |

(Continued)

(52) U.S. Cl.
CPC ...... *H01L 21/02631* (2013.01); *C01B 25/006* (2013.01); *C01B 25/023* (2013.01); *H01L 21/02422* (2013.01); *H01L 21/02521* (2013.01); *H01L 21/6835* (2013.01); *H01L 23/3157* (2013.01); *H01L 29/26* (2013.01); *H01L 29/786* (2013.01); *H01L 29/78696* (2013.01); *H01L 2221/68304* (2013.01)

(58) Field of Classification Search
CPC .................................................. H01L 21/02631

USPC .......................................................... 257/288
See application file for complete search history.

(56) References Cited

U.S. PATENT DOCUMENTS

| | | | | |
|---|---|---|---|---|
| 6,096,454 | A * | 8/2000 | Tran | H01M 4/0438 429/231.8 |
| 2016/0178569 | A1* | 6/2016 | Hoffman | G01N 27/4146 257/29 |
| 2017/0261465 | A1* | 9/2017 | Balijepalli, IV | G01N 27/4148 |

(Continued)

OTHER PUBLICATIONS

Doganov et al. (Transport properties of pristine few-layer black phosphorus by van der Waals passivation in an inert atmosphere Nature Communications, vol. 6, Article No. 6647 (2015)).*

(Continued)

*Primary Examiner* — Jami Valentine Miller
(74) *Attorney, Agent, or Firm* — Wolf, Greenfield & Sacks, P.C.

(57) ABSTRACT

A scalable approach for the synthesis of black phosphorus (BP) material thin films over large areas is described. A red phosphorus (RP) material thin film may be deposited on a substrate followed by conversion to a BP material thin film using high-pressure alone or high pressure and high temperature. A thin-film of dielectric material such as hexagonal boron nitride (hBN) can be formed on a RP material film before the conversion is performed to improve the crystalline quality and stability of the converted BP material. Surprisingly, an atomically sharp and defect-free interface can be formed between the converted BP material and hBN. The BP material has high crystalline uniformity and can be used to fabricate thin-film transistors and optoelectronic devices such as infrared photodetectors.

25 Claims, 12 Drawing Sheets

(51) Int. Cl.
H01L 29/26 (2006.01)
H01L 21/683 (2006.01)

(56) References Cited

U.S. PATENT DOCUMENTS

2018/0012962 A1* 1/2018 Yeh .................... H01L 27/0886
2019/0137443 A1* 5/2019 Balijepalli ......... G01N 27/4145

OTHER PUBLICATIONS

Bridgman, Two new modifications of phosphorous. Journal of the American Chemical Society. Jul. 1914;36(7):1344-63.
Bridgman, Effects of High Shearing Stress Combined with High Hydrostatic Pressure. *Physical Review*. Nov. 1935;48(10):825-47.
Bridgman, Shearing Phenomena at High Pressures, Particularly in Inorganic Compounds. *Proceedings of the American Academy of Arts and Sciences*. Jan. 1937;71(9):387-460.
Bridgman, The Compression of 39 Substances to 100,000 Kg/Cm. *Proceedings of the American Academy of Arts and Sciences*. Mar. 1, 1948;76(3):55-70.
Bridgman, Two New Phenomena at Very High Pressure. *Physical review*. Jun. 1, 1934;45(11):844-845.
Brown et al., Refinement of the crystal structure of black phosphorus. *Acta Crystallographica*. Oct. 1965;19(4):684-5.
Buscema et al. Fast and Broadband Photoresponse of Few-Layer Black Phosphorus Field-Effect Transistors. *Nano Letters*. Jun. 11, 2014; 14(6): 3347-52.
Chen et al., Electrochemical gate-controlled charge transport in graphene in ionic liquid and aqueous solution. *Journal of the American Chemical Society*. Jul. 2, 2009;131(29):9908-9.
Cho et al. High-Capacitance Ion Gel Gate Dielectrics with Faster Polarization Response Times for Organic Thin Film Transistors. *Advanced Materials*. Feb. 2008 20(4): 686-90.
Deng et al. Efficient electrical control of thin-film black phosphorus bandgap. Nat. Commun. 2017;8:14474 doi: 10.1038/ncomms14474.
Endo et al., Growth of large single crystals of black phosphorus under high pressure. Japanese Journal of Applied Physics. Aug. 1982;21(8A):L482-4.
Engel et al. Black Phosphorus Photodetector for Multispectral, High-Resolution Imaging. Nano Lett. Oct. 15, 2014; 14(11):6414.7.
Fei et al. Strain-Engineering the Anisotropic Electrical Conductance of Few-Layer Black Phosphorus. *Nano Letters*. May 14, 2015; 14(5): 2884-9.
Fei et al., Ferroelectricity and phase transitions in monolayer group-IV monochalcogenides. Physical Review Letters. Aug. 23, 2016;117(9):097601.
Graham. Recent developments in conventional high-pressure methods. *Journal of Geophysical Research: Solid Earth*. Apr. 10, 1986; 91(B5): 4630-42.
Hooton, The deposition of thin films of red phosphorus. *Nuclear Instruments and Methods*. Jul. 1, 1964;27(3):338.
Huang et al. Effects of dimethylolpropionic acid modification on the characteristics of polyethylene terephthalate fibers. *Molecular medicine reports*. Jul. 30, 2012; 6(4): 709-15.
Hultgren et al., The Atomic Distribution in Red and Black Phosphorus and the Crystal Structure of Black Phosphorus. *The Journal of Chemical Physics*. Jun. 1935;3:351-5.
Kikegawa et al. An X-ray diffraction study of lattice compression and phase transition of crystalline phosphorus. *Acta Crystallographica Section B: Structural Science*. Apr. 1, 1983; 39(2): 158-64.

Kim et al., Observation of tunable band gap and anisotropic Dirac semimetal state in black phosphorus. Science. Aug. 14, 2015;349(6249):723-6.
Koenig et al. Electric field effect in ultrathin black phosphorus. *Applied Physics Letters*. Mar. 10, 2014, 104(10): 103106.
Kopf et al. Access and in situ growth of phosphorene-precursor black phosphorus. *J. Cryst. Growth*. Nov. 1, 2014; 405: 6-10.
Krebs et al. Über die Struktur and Eigenschaften der Halbmetalle. VIII. Die katalytische Darstellung des schwarzen Phosphors. *Zeitschrift Fur Anorganische Und Allgemeine Chemie*. Aug. 1955;280(1-3) 119-33.
Lange et al. $Au_3SnP_7$@Black Phosphorus: An Easy Access to Black Phosphorus. *Inorganic Chemistry*. May 1, 2007;46(10):4028-35.
Li et al. Black phosphorous field-effect transistors. *Nat Nano* May 2014; 9(5): 372-7.
Li et al., Direct observation of the layer-dependent electronic structure in phosphorene. Nature nanotechnology. Jan. 2017;12(1):215.
Li et al., Quantum Hall effect in black phosphorus two-dimensional electron system. Nature nanotechnology. Jul. 2016;11(7):593-7.
Li et al., Synthesis of crystalline black phosphorus thin film on sapphire. Advanced Materials. Feb. 2018;30(6):1703748.
Li et al., Synthesis of thin-film black phosphorus on a flexible substrate. 2D Materials. Aug. 6, 2015;2(3):031002.
Liu et al. Phosphorene: an unexplored 2D semiconductor with a high hole mobilty. *ACS Nano*. Mar. 21, 2014; 8(4): 4033-41.
Liu et al. Semiconducting black phosphorus: synthesis, transport properties and electronic applications. *Chem Soc Rev*. Apr. 28, 2015; 44(9):2732-43.
Long et al., Achieving ultrahigh carrier mobility in two-dimensional hole gas of black phosphorus. Nano letters. Dec. 5, 2016;16(12):7768-73.
Morita. Semiconducting black phosphorus. *Applied Physics A*. Apr. 1, 1986;39(4):227-42.
Nilges et al. A fast low-pressure transport route to large black phosphorus single crystals. *Journal of Solid State Chemistry*. Aug. 2008; 181(8): 1707-11.
Östmark et al. Raman spectra of $P_4$ at low temperatures. *The Journal of Chemical Physics*. Sep. 22, 2003;119(12):5918-22.
Pomian et al. Raman scattering in highly disordered amorphous phosphorus. *Physical Review B*. Apr. 15, 1983;27(8):4887-94.
Qiao et al. High-mobility transport anisotropy and linear dichroism in few-layer black phosphorus. *Nat Commun*. Jul. 21, 2014; 5: 4475.
Rissi et al. Pressure-induced crystallization of amorphous red phosphorus. *Solid State Commun*. Mar. 2012; 152(5): 390-4.
Shanabrook et al. Structural and vibrational properties of amorphous phosphorus. *Physical Review B*. Oct. 15, 1981;24(8):4771-80.
Sorgato et al., Red to black phosphorus transition up to 65 kbar. High Temperatures-High Pressures: Thermophysical Properties: Fundamentals and Applications. 1970;2:105-11.
Sugai et al. Raman and infrared reflection spectroscopy in black phosphorus. *Solid State Commun*. Mar. 1985; 53(9): 753-5.
Wang et al., Highly anisotropic and robust excitons in monolayer black phosphorus. Nature nanotechnology. Jun. 2015;10(6):517-21.
Xia et al. Rediscovering black phosphorus as an anisotropic layered material for optoelectronics and electronics. *Nat Commun*. Jul. 21, 2014; 5: 4458.
Xia et al. Two-dimensional material nanophotonics. *Nat Photon*. Dec. 2014; 8(12): 899-907.
Yuan et al., Polarization-sensitive broadband photodetector using a black phosphorus vertical p—n junction. Nature nanotechnology. Aug. 2015;10(8):707-13.

* cited by examiner

WAFER-SCALE SYNTHESIS OF LARGE-AREA BLACK PHOSPHORUS MATERIAL HETEROSTRUCTURES

RELATED APPLICATIONS

This application claims priority under 35 U.S.C. § 119(e) to U.S. Provisional Application Ser. No. 62/482,333, titled "Wafer-Scale Synthesis of Large-Area Hexagonal Boron Nitride/Black Phosphorus Hetero structures" filed Apr. 6, 2017, the contents of which is incorporated herein by reference in its entirety.

GOVERNMENT SUPPORT

This invention was made with government support under Grant Nos. N00014-14-1-0565 and N00014-15-1-2733 awarded by The Office of Naval Research and under EFMA-1542815 awarded by National Science Foundation. The government has certain rights in the invention.

BACKGROUND

Black phosphorus is a particular form of the element phosphorus, and has been recognized as having desirable electronic and optoelectronic properties. Black phosphorus can be produced from other forms of phosphorus (such as white phosphorus or red phosphorus) by applying high pressure or high pressure and heat to the phosphorus. A desirable property of black phosphorus (when formed in a thin film) is an electrically tunable band gap around 0.3 eV that is useful as a semiconductor for integrated circuit and photonic applications. Another desirable property is a potentially high mobility (well over 1000 $cm^2$ $V^{-1}$ $s^{-1}$) for both electrons and holes in thin films of black phosphorus.

Conventionally, thin black phosphorus has been produced from bulk black phosphorus by exfoliation. The resulting sample size of a thin exfoliated layer is on the order of a few micrometers or tens of micrometers in diameter, and the exfoliation process does not reliably produce uniform layers of black phosphorus. Also, such small sample sizes are not suitable for manufacturing large volumes of microelectronic devices.

SUMMARY

Methods for forming thin-film black phosphorus materials on substrates are described. The processes are suitable for synthesizing black phosphorus materials on large-area wafers that may be used in semiconductor manufacturing processes, for example. A wafer's lateral dimension may be millimeters to tens of centimeters and is limited only by the equipment's wafer-size handling capability. High quality thin films of black phosphorus materials may be formed to cover over 90% of the wafer's process-side surface. According to some embodiments, the thin films may potentially cover essentially all of a wafer's process-side surface. In some cases, the thin film may be capped or encapsulated by a high quality thin film of hexagonal boron nitride or other dielectric material, which can act as a passivating dielectric coating to prevent oxidation of the black phosphorous material. In some embodiments, the capping dielectric can be used as a gate dielectric in a transistor formed from black phosphorus material. In some implementations, the capping or encapsulating dielectric material can form at least one low-defect, atomically-sharp interface in a region across the wafer in which there are no or fewer than 5 interfacial defects. In some cases, regions spanning as much as 2 microns across a surface of the substrate have low-defect, atomically-sharp interfaces that can lead to good transistor or device performance. In some cases, regions spanning as much as 10 microns across a surface of the substrate have low-defect, atomically-sharp interfaces.

Some embodiments relate to a wafer comprising a substrate, a layer of black phosphorous material formed over a first area of the substrate, and a layer of dielectric material formed over the black phosphorous material in the first area, wherein a first interface between the black phosphorous material and the dielectric material extending for as much as one micron across the first area has no or fewer than 5 defects, such as stacking faults. In some cases, the first interface between the black phosphorous material and the dielectric material extends a distance between one micron and 10 microns across the first area and has no or fewer than 5 defects. In some cases, the distance in which there are no or fewer than 5 defects is as much as 100 microns.

Some embodiments relate to a method of forming black phosphorous material on a substrate. The method may comprise acts of depositing a layer of red phosphorous material on the substrate; depositing a dielectric material over the red phosphorous material; and heating the substrate, the layer of red phosphorous material, and the dielectric material at temperatures up to 500 degrees Celsius under elevated pressure. In some aspects, the elevated pressure is between $0.2 \times 10^9$ Pascals and $7 \times 10^9$ Pascals. In some aspects, a method may further comprise heating the sapphire substrate, the layer of red phosphorous material, and the dielectric material at temperatures up to 1000 degrees Celsius under the elevated pressure.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Figure 1A:
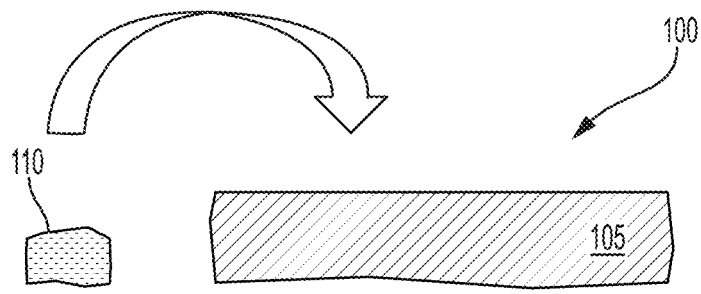
FIG. 1A and FIG. 1B depict, in overview, materials associated with a process of forming a thin film of red phosphorus (RP) material on a substrate, according to some embodiments.

Features and advantages of the illustrated embodiments will become more apparent from the detailed description set forth below when taken in conjunction with the drawings.

DESCRIPTION

Black phosphorus (BP) in thin-film, orthorhombic phase has recently attracted significant attention in the layered material community due to potentially high electron and hole mobilities, a widely tunable electronic bandgap, and highly anisotropic in-plane electronic and optical properties. These properties make BP a potential candidate for various nanoelectronic and nanophotonic applications (e.g., for making high-performance radio-frequency transistor and mid-infrared detectors). In addition to the orthorhombic phase, which is stable under ambient conditions, BP can also be in the rhombohedral or simple cubic phase. Under high pressure, BP reversibly transits from orthorhombic into rhombohedral phase at about 5 GPa at room temperature and then to simple cubic phase at about 10 GPa. The latter phase transition is almost independent of temperature. In 1914, it was reported that white phosphorus (WP) can be converted to BP under a hydrostatic pressure of 1.2 GPa at 200° C. within 5 to 30 min (Bridgman, P. W. *Journal of the American Chemical Society* 1914, 36, 1344-1363). The same researcher later prepared BP at room temperature from WP at about 3.4 GPa, and converted red phosphorus (RP) to BP at 8.5 GPa at room temperature. Another approach to making BP comprised melting BP at a temperature of 900° C. under a hydrostatic pressure of 1 GPa. Using this process, a BP single crystal larger than 5×5×10 mm$^3$ was achieved (Endo, S.; Akahama, Y.; Terada, S.; Narita, S. *Jpn. J. Appl. Phys. Part 2*—Lett. 1982, 21, L482-L484). Alternative BP synthesis techniques (e.g., based on catalyzing reactions without using high pressure) have also been developed. To form a thin film of BP on a substrate, a thin film may be exfoliated from a sample of BP and transferred onto the substrate.

Although several methods have been developed for producing bulk black phosphorus or black phosphorus powder, a process for forming high-quality thin-film BP material over large areas has not been developed. Because of desirable electronic and optoelectronic properties of BP, thin films of the material would be useful for developing microelectronic or micro-optoelectronic devices based on BP material. The inventor has realized and appreciated that it would be desirable to form high-quality thin films of BP material over large substrate areas, so that multiple devices could be manufactured simultaneously and at lower cost. The inventor has realized how to deposit a thin film of red phosphorus material onto a substrate, which may be flexible or rigid and can have a very large area compared to micron-sized exfoliated samples of BP. The area of the substrate may only be restricted by the reaction chamber size. The inventor has realized and appreciated that the RP material film deposited on a substrate can be converted into a black phosphorus material film of semiconductor-grade quality over a large area of the substrate.

Embodiments described below may be used to produce thin films of high-quality black phosphorus (BP) material over large areas (e.g., wafer sizes ranging from millimeters to tens of centimeters, or even larger). Black phosphorus materials include essentially pure orthorhombic phase phosphorus (e.g., at least 98% pure phosphorus by weight) and alloys or compounds of phosphorus in orthorhombic phase or other crystalline phase. Alloys or compounds of phosphorus can include compositions comprising mainly phosphorus (P) and one or any combination of the following materials: arsenic (As), antimony (Sb), and bismuth (Bi). An alloy may be expressed as $P_xY_{1-x}$ where P represents phosphorus, Y represents one or any combination of As, Sb, and Bi, and x represents a fractional atomic composition. In embodiments, the value of x may be in a range expressed by $0.5 \leq x \leq 0.8$. In some cases, the value of x may be in a range expressed by $0.2 \leq x \leq 0.8$. As described further below, BP material can be formed from red phosphorus (RP) material, which can include essentially pure red phosphorus (e.g., at least 98% pure red phosphorus by weight) and alloys or compounds comprising both non-orthorhombic red phosphorus and other materials from the same group (such as As, Sb, or Bi).

Figure 1B:
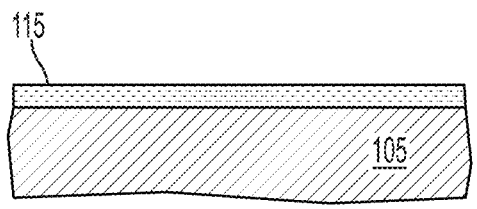

In overview, thin-film BP materials of high quality can be produced, according to some embodiments, by methods including steps depicted in FIG. 1A through FIG. 1D. For example, a red phosphorus (RP) material powder or solid 110 may be heated or sputtered in vacuum to deposit a thin film of RP material 115 on a substrate 105. A portion of a substrate 105 is depicted in the drawings. In some cases, electron-beam evaporation of the RP material may be used to form the film of RP material 115 on the substrate 105. An example film 115 of red phosphorus material is shown in FIG. 1B. The RP material film 115 may have a chemical composition of essentially pure phosphorus (e.g., at least 98% purity by weight) or comprise an alloy of phosphorous $P_xY_{1-x}$ as described above, but not be in orthorhombic phase.

The term "substrate" is used hereafter to include wafers comprising substrates formed from any suitable material. Preferably, the substrate 105 is inert to RP material. A substrate 105 may be formed from a bulk material and be rigid or flexible, conducting, semiconducting, or an insulator. In some cases, a substrate 105 may comprise one layer of material, or may comprise multiple layers of different materials deposited on the bulk material prior to deposition of a RP material film 115.

Figure 1C:
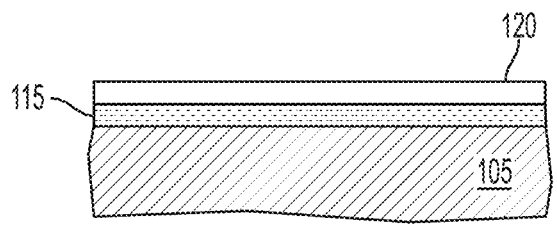
FIG. 1C and FIG. 1D depict, in overview, materials associated with a process of capping a thin film of red phosphorus (RP) material on a substrate and transforming the RP material to black phosphorus (BP) material, according to some embodiments.
Figure 1D:
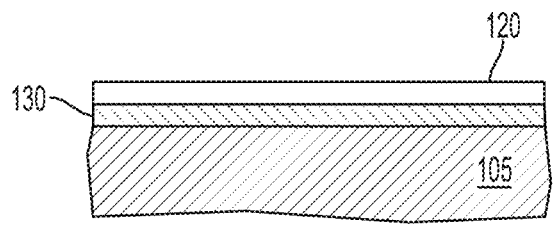

After deposition of a RP material film 115, the film can be capped with a dielectric film 120, as depicted in FIG. 1C. In some embodiments, the dielectric film 120 has a crystalline structure. The substrate 105, film 115, and capping dielectric film 120 can then be subjected to high pressures for a period of time at room temperature or at elevated temperatures, which can convert the film of red phosphorus material 115 to a film of black phosphorus material 130, as depicted in FIG. 1D.

Figure 2:
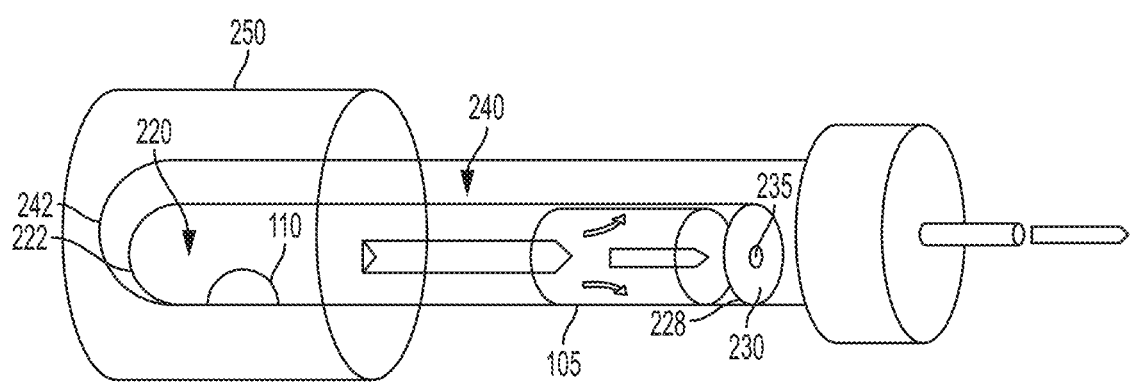
FIG. 2 depicts apparatus for depositing a RP material film on a substrate, according to some embodiments.

In further detail, FIG. 2 depicts one embodiment of apparatus that can be used to form a thin film of red phosphorus material on a flexible polymeric substrate 105 or rigid substrate (not shown). A flexible substrate may comprise polyethylene terephthalate (PET), though other polymers may be used and the invention is not limited to only polymeric substrates. Although a flexible substrate is depicted in FIG. 2, a rigid substrate (e.g., a sapphire substrate, a silicon substrate, etc.) may be used in some embodiments. According to some embodiments, a red phosphorus powder or solid 110 may be loaded into a high-temperature inner chamber 220 (e.g., a quartz tube) that has one closed end 222 and one open end 228. The RP material powder 110 may be located near the closed end 222 of the inner chamber 220. A lateral dimension (e.g., inner diameter) of the inner chamber may be between 5 mm and 200 mm, though larger sizes may be used to accommodate larger substrates.

One or more substrates 105 (flexible or rigid) to be coated with a film of RP material may be mounted in the inner chamber 220 near the inner chamber's open end 228. In some embodiments, a flexible substrate (e.g., PET substrate) having a lateral dimension less than or equal to a circumference associated with an inner diameter of the inner chamber 228 may be rolled to line at least a portion of the inner wall of the inner chamber near the inner chamber's open end 228, as depicted in FIG. 2. In various embodiments, the substrate 105 may comprise a surface that is chemically inert to red phosphorus material. In some embodiments, a cover 230 may be placed over the open end 228 of the inner chamber after loading the substrate(s) 105. The cover 230 may include a small hole 235 (e.g., having a diameter between 50 microns and 2 millimeters) to restrict the flow of phosphorus vapor so that the deposition of phosphorus onto the substrate(s) 105 can be efficient.

According to some embodiments, the covered inner chamber 228 may then be loaded into a larger vacuum chamber 240 (e.g., a quartz tube or chamber having an inner diameter or size larger than an outer diameter or size of the inner chamber). One end 242 of the vacuum chamber may be mounted in or by heating elements 250. In some embodiments, when the inner chamber 220 is mounted within the vacuum chamber 240, the substrate 105 to be coated may be located a suitable distance from the heating elements so that the substrate is not heated. In other embodiments, the substrate may be heated during deposition.

According to some implementations, an inner chamber 220 may not be used. Instead, walls of the vacuum chamber 240 may be lined with a sacrificial foil (e.g., aluminum foil) and the RP material 110 and substrate(s) 105 may be mounted directly in the vacuum chamber 240.

Once the RP material 110 and substrate(s) 105 are sealed within the vacuum chamber 240, the chambers 220, 240 may be evacuated to sub-atmospheric pressures. According to some embodiments, the pressure in the inner chamber 220 is reduced so that it is no higher than 100 milliTorr. In some cases, the pressure may be no higher than 10 milliTorr.

The red phosphorus material 110 may then be heated so that it sublimates or otherwise produces phosphorous vapor in the inner chamber 220 for the example shown. The phosphorous vapor may include other materials present in the red phosphorus material 110. In some embodiments, the RP material 110 may be heated to a temperature between 350° C. and 450° C., and held at the temperature for a duration between 5 minutes and 15 minutes. A very thin film (e.g., between 5 nm and 500 nm thick) of red phosphorus material deposits onto the substrate(s) 105 from the phosphorus vapor. A thickness of the RP material film can depend upon several factors (e.g., distance of substrate(s) 105 from the RP material 110, pressure in the inner chamber 220, average temperature during material deposition, and time duration of material deposition. After deposition of the thin RP material film, the substrate(s) 105 may be removed from the vacuum chambers 220, 240 for further processing. The substrate(s) 105 may be maintained in a stable environment (e.g., a nitrogen environment) after removal from the vacuum chamber to avoid or minimize oxidation of the RP material film.

Figure 11:
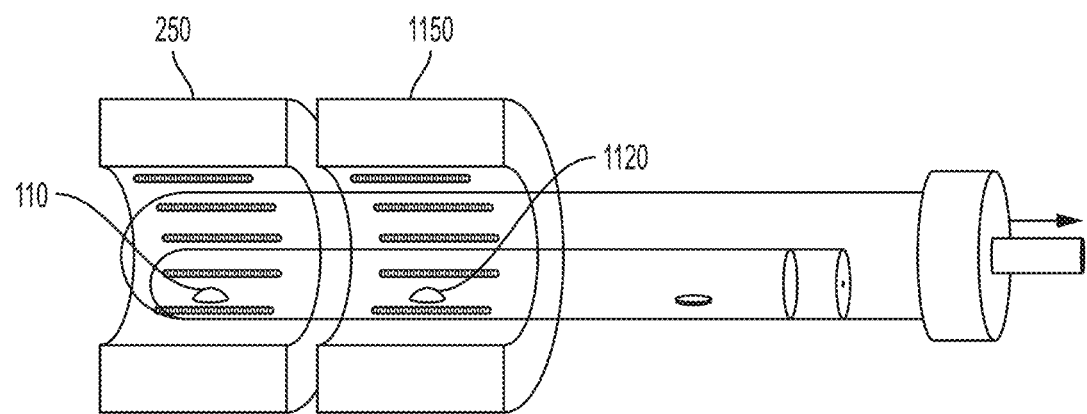
FIG. 11 depicts apparatus for depositing a RP material film on a substrate, according to some embodiments.

Another example deposition apparatus is depicted in FIG. 11. In some cases, a first heating element 250 can be used to heat pure RP powder 110 and a second heating element 1150 can be used to heat a secondary material 1120 (e.g., bismuth, antimony, arsenic) to form a RP material film on a substrate in the inner chamber. By using two heating elements, the temperatures for the pure RP power 110 vaporization and secondary material 1120 vaporization can be controlled separately to improve deposition of a RP material film and to control composition ratios of the RP material film.

According to some embodiments, the RP material film 115 on a substrate 105 may be capped, at least partially, with a thin film 120 (e.g., between 3 nanometers and 50 nanometer thick) of dielectric material before loading shaped substrates into a high-pressure apparatus. An example dielectric material is hexagonal boron nitride (hBN), though other dielectric materials may be used in some cases. Other dielectric materials include, but are not limited to silicon nitride, aluminum oxide, and hafnium oxide. The dielectric film 120 may be produced separately and physically transferred onto the surface of the RP material film 115 (e.g., using an exfoliation process in which a layer from a handling substrate is bonded to the RP material film 115 and exfoliated from the handling substrate). In some cases, a dielectric film 120 can be formed by atomic layer deposition (ALD). In embodiments, the dielectric film 120 comprises a crystalline structure. The dielectric film 120 may be applied before or after shaping the substrates 105 for the high-pressure apparatus. In some cases, the deposition of a dielectric film 120 onto the RP material film 115 may be performed in high vacuum to improve the adhesion of the dielectric film. The dielectric/RP-covered substrate(s) may then be subjected to very high pressures or heat and very high pressures as described further below to convert the RP material to black phosphorus material.

In some embodiments, the dielectric film 120 may be applied to selected areas of the substrate over the RP material film 115 according to a predetermined pattern. For example, thin strips of dielectric film 120 may be applied across the RP material film 115 in regions where gate electrodes for transistors will be formed.

Referring again to FIG. 2, according to one fabrication process, about 5 milligrams of RP material powder 110 can be placed inside a quartz tube inner chamber 220 near its closed end 222. A substrate 105 comprising a polyethylene terephthalate (PET) film (measuring 40 mm×50 mm×75-µm thick) may be wrapped on the inside wall of the inner chamber 220 close to the tube's open end 228. The open end 228 of the tube may be covered by a thin polyester film cover 230 with a ~0.5-mm diameter pin hole 235 near the center of the tube's open end 228. The inner chamber 220 may be loaded into a 50-mm-diameter quartz tube vacuum chamber 240, with the RP material powder 110 located near the center of a heating zone at one end of the vacuum chamber 242. The PET substrate 105 may be located outside of the heating zone, where the temperature is kept near room temperature during the deposition process. For high-temperature substrates (e.g., sapphire, silicon, silicon carbide, diamond, fused silica, etc.), the substrate may be located outside, near, or in the heating zone. The vacuum chambers 220, 240 may be evacuated by a mechanical pump to a pressure under 10 mTorr.

According to some embodiments, the RP material powder 110 may be heated up to a peak temperature between 400° C. in about 10 minutes and held at this temperature between 10 minutes and 60 minutes. Under these temperatures and vacuum conditions, red phosphorus 110 begins evaporating and condensing onto the substrate 105 to form a thin film, whose thickness may be controlled by the holding time at 400° C. Other peak temperature values in a range from 200° C. to 800° C. may be used in some embodiments.

During deposition of RP material, a transparent PET film or other transparent substrate 105 can change appearance to a reddish-brown color after about 40 minutes. Longer deposition time results in a thicker RP material film and can be seen by the decrease in optical transparency of the RP-coated substrate 105. The red-brown color suggests that the deposited film is red phosphorus and not white phosphorus. Beneficially, a RP material film is stable and does not spontaneously combust upon removal to air, which would occur for white phosphorus. The RP material film is continuous and uniform over most of the substrate's surface except near the edges.

Conversion of a RP material film 115 to black phosphorus material 130 may be done in several ways. According to some methods, a substrate 105 may be shaped to fit into a high-pressure apparatus (e.g., a Kawai-type multi-anvil apparatus, a cubic anvil, a uniaxial press, tetrahedral press, etc.). A multi-anvil apparatus can be used to produce high pressure in a small volume to simulate hydrostatic pressures within planets. In some cases, the substrate 105 may be cut or otherwise shaped to fit into the high-pressure apparatus. As one non-limiting example, substrates 105 may be shaped in discs having a diameter between 4 mm and 7 mm suitable for mounting in a Kawai-type multi-anvil apparatus. As another non-limiting example, substrates 105 may be shaped in discs or rectangles have a diameter or edge length between 5 mm and 75 mm or larger, suitable for mounting in a uniaxial press.

One or more shaped substrates 105 covered, at least in part, with a film 115 of RP material and capping or encapsulating dielectric film(s) 120 may be loaded into the high-pressure apparatus (e.g., stacked in the apparatus) and subjected to very high pressures for a period of time. In some cases, the substrate(s) and RP material may be subjected to elevated temperatures while subjected to the high pressures. Pressures applied to the substrates may range between $0.2 \times 10^9$ Pascals (0.2 GPa) and 10 GPa, according to some embodiments. In some implementations, pressures applied to the substrates may be in a range between 0.2 GPa and 2 GPa. The applied temperatures may be in a range between 100° C. and 900° C., according to some embodiments. The temporal duration of the applied high pressures may be between 1 hour and 12 hours, according to some embodiments. In some implementations, multiple discs (up to 10) coated with RP material film 115 and a capping or encapsulating dielectric film(s) 120 may be stacked together and loaded into a multi-anvil chamber or other high-pressure apparatus in a single run. For example, multiple substrates can be stacked in a Boyd-England piston cylinder, placed under high pressure, and heated.

According to some embodiments, one or more high-temperature substrates coated with RP material and optionally overcoated with a capping dielectric material (e.g., hBN) may be loaded into a uniaxial press, which allows for larger substrate sizes than a multi-axis anvil. Sapphire may be a beneficial high-temperature substrate in some embodiments, since it is stable at high temperatures and pressures, available at low cost, and is also suitable for synthesis of high-quality hBN films. The pressure in the uniaxial press may be ramped up and down according to the following sequence: increase to essentially 1.5 GPa over a period of approximately 1 hour, hold at essentially 1.5 GPa for approximately 5 hours, and decrease to ambient pressure over a period of approximately 1 hour. Each of these time durations may vary by as much as 20% in some cases. In some embodiments, the pressure may be ramped up to a peak value between 0.2 GPa and 10 GPa, held for a time duration, and then reduced. Before applying pressure to the high-temperature substrate(s), or after reaching a peak pressure, the temperature of the substrate(s) and films may be increased to a value between 400° C. and 1000° C., and held for the duration of the applied high pressure. The temperature may then be reduced during or before the reduction of applied pressure.

Figure 3:
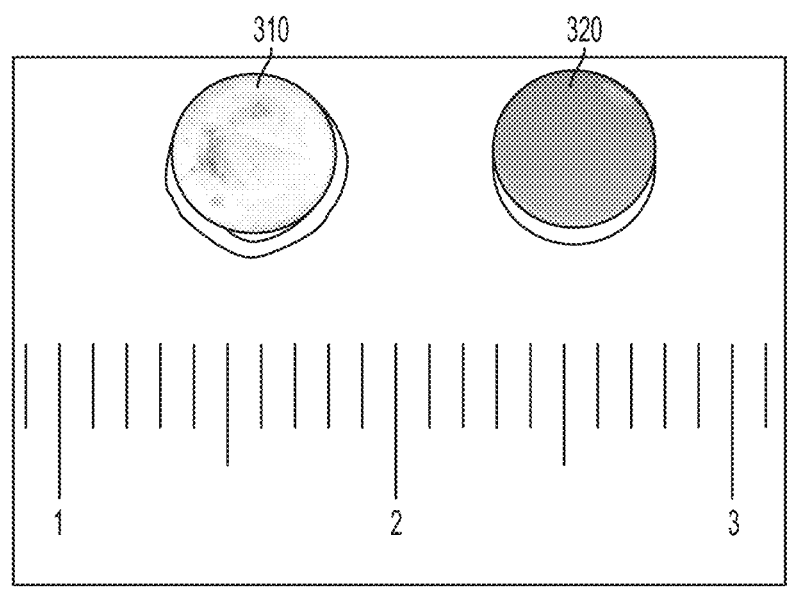
FIG. 3 is an enlarged photograph of two sapphire substrates. The substrate on the left is coated with a thin film of black phosphorus (~30 nm thick). The substrate on the right is uncoated. The numbers on the scale correspond to centimeters.

An example of a sapphire substrate (approximately 4 mm in diameter) having a converted BP film formed thereon and formed according to the above-described embodiments is depicted in FIG. 3 (left disc). The thickness of the BP film is about 30 nm and covers the majority of the substrate surface. The surface 310 of the substrate appears lighter, because it is more reflective than the bare, uncoated surface 320 of a sapphire substrate shown on the right side of FIG. 3. Some delamination of the BP film occurs, which is likely a result of stacking discs in the high-pressure apparatus and subsequently separating the discs. Such delamination may be reduced when capping the RP material film with a dielectric film prior to high-pressure treatment.

Although the embodiments described above include capping RP material films with a dielectric, some methods may not cap the RP material film 115. Instead, the RP material may be deposited in a film on a stiff substrate or coated substrate having a crystalline structure (e.g., sapphire, silicon carbide, silicon-carbide coated substrate, diamond-coated, etc.). In some cases, a dielectric film (e.g., hexagonal boron nitride) can be applied to the surface of the substrate prior to deposition of the RP material film 115. The RP material film 115 may then be converted to a BP material film 130 under pressure without a capping dielectric film 120. Whether capped or not, the resulting BP material film 130 can be a few-layers film (up to 20 atomic layers) or a film having a thickness up to 500 nm. The thickness of the resulting film can be controlled by controlling an amount of RP material deposition.

Several results of BP films converted from RP power will now be described. For comparison purposes, results of BP films produced from uncapped RP films formed on a polymeric substrate are also described here and in further detail in X. Li et al., "Synthesis of Thin-Film Black Phosphorus on a Flexible Substrate," 2D Materials, 2, Aug. 2015, 031002, which is incorporated herein by reference in its entirety.

An uncapped RP-coated PET substrate 105 prepared according to the embodiments described above was cut into discs and sandwiched by two pyrophyllite rods with the same diameter. The diameter of the discs was between 4 mm and 5 mm. The rods and discs could be loaded into a chromium-doped magnesium oxide (MgO) octahedron pressure medium for pressurization in a 1000-ton Kawai-type multi-anvil apparatus, for example. The pressure in the multi-anvil cell was ramped up and down according to the following sequence: increase to 10 GPa over a period of 4 hours, hold at 10 GPa for 6 hours, and decrease to ambient pressure over a period of 3 hours. Each of these time durations can be varied by as much as 20% in methods of forming BP material films.

After high-pressure treatment, the diameter of polymeric discs can shrink by as much as 20%, and the color of the film may become grey while remaining semi-transparent. The changed color suggests conversion from red phosphorus to black phosphorus, which can be confirmed by Raman spectroscopy measurements or other tests described below.

Figure 4A:
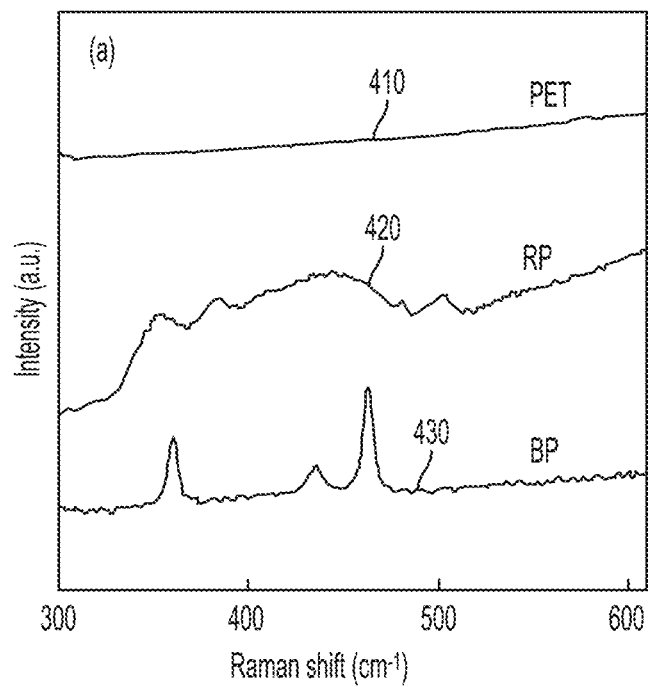
FIG. 4A plots results from Raman spectroscopy measurements of a polyethylene terephthalate (PET) substrate, a RP film formed on the PET substrate, and a BP film formed on the flexible PET substrate by conversion of the RP film.
Figure 4B:
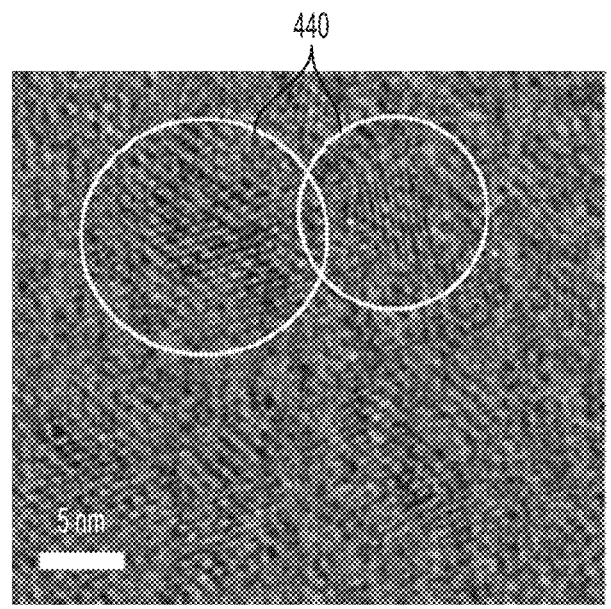
FIG. 4B is a transmission electron microscope (TEM) image of black phosphorus formed on a flexible polymeric substrate. Crystalline grain sizes of BP for this region of the sample are on the order of 10-20 nm in diameter.
Figure 4C:
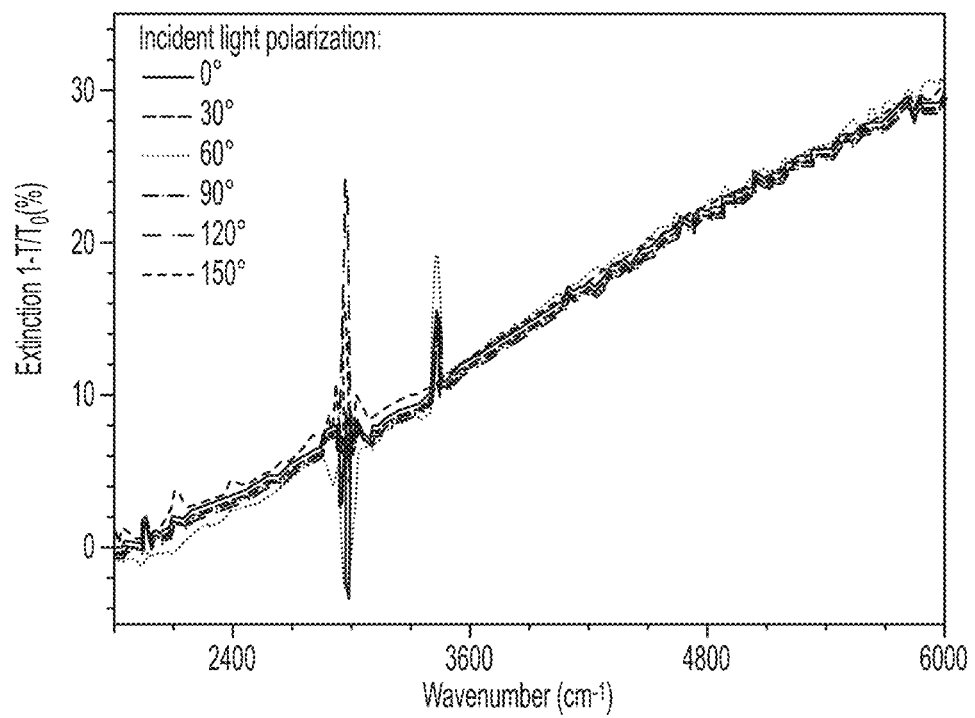
FIG. 4C plots polarization-resolved optical extinction spectra for a thin BP film formed on the flexible PET substrate.

Spectroscopy measurements can be used to characterize the RP material and BP material thin films. FIG. 4A plots Raman spectra for a PET substrate (spectrum 410), a RP film deposited on the PET substrate (spectrum 420), and a converted BP thin film formed on the PET substrate (spectrum 430). The results shown in FIG. 4A-FIG. 4C are for a RP film formed on a PET substrate using very high pressures (up to 10 GPa) at room temperature as described above. There are no prominent features from the Raman spectrum 410 measured from the PET substrate in the investigated region (300 cm$^{-1}$-610 cm$^{-1}$). The Raman spectrum 420 from the as-deposited RP film shows typical RP characteristic peaks at ~350 cm$^{-1}$, 380 cm$^{-1}$, 440 cm$^{-1}$, and 500 cm$^{-1}$, indicating that the film comprises primarily red phosphorus, and not white phosphorus. The relatively low intensity of the peak at 350 cm$^{-1}$ indicates that the RP film is disordered. Although at temperatures below 800° C., phosphorus vapor may condense to form a mixture of WP and RP, the predominantly RP thin film formation may be due to conversion of WP to RP upon exposure to ambient light in the transparent quartz tubes used in some embodiments.

After pressurization, the material changes. The Raman spectrum 430 measured for the film after pressurization shows typical BP characteristic peaks at ~360 cm$^{-1}$, 435 cm$^{-1}$, and 463 cm$^{-1}$. These peaks confirm conversion of the RP to BP due to pressurization.

Cross-sectional samples of the RP and BP thin films can be prepared by mechanical wedge polishing, followed by ion milling as a final step, for examination with a transmission electron microscope (TEM). To prepare BP TEM samples, focused ion beam milling can be used to prepare a cross-sectional surface for TEM imaging and avoid delamination issues that would otherwise occur during mechanical polishing of the samples.

The crystalline nature of a converted BP film can be observed and verified by TEM imaging. At low magnification, a TEM image of a cross section of the BP/PET film shows the thickness of the BP film to be about 40 nm, similar to the thickness of RP before conversion. A high-resolution TEM image, shown in FIG. 4B, indicates a polycrystalline BP structure for the BP formed on the PET polymeric substrate without a capping dielectric layer. In the comparative example, the BP grain sizes (diameter or maximum transverse length indicated by circles 440) may be between 5 nm and 50 nm when the BP is formed using high pressures only and no heating.

Optical properties of a BP film can be characterized using Fourier-transform infrared spectroscopy (FTIR). FIG. 4C plots the extinction in optical transmission, 1-T/T$_0$, as a function of wavenumber, and characterizes the infrared response of the polycrystalline BP thin-film under different incident light polarizations. In the expression for extinction, T is the transmission of the light through the BP film and the substrate (PET for the example measurement), while T$_0$ is the transmission through the substrate only. The results for the BP formed from a RP thin film on a PET substrate qualitatively agree with the spectra obtained from exfoliated BP, although no in-plane anisotropy is observed due to the nanoscale grains with random crystalline orientations in the formed BP thin film (as indicated in the results of FIG. 4B). The FTIR measurement further confirms the BP phase by the rise of absorption at ~2200 cm$^{-1}$, indicating a bandgap of around 0.28 eV, close to the bandgap of 0.3 eV observed in exfoliated flakes. The kinks near 2970 cm$^{-1}$ and 3430 cm$^{-1}$ result from vibrations of hydroxyl (—OH) and methyl (—CH$_3$) groups in the PET substrate, respectively.

The inventor has realized and appreciated that improvements in the crystalline quality of BP thin films can be obtained by elevating the temperature of the RP material during the application of high pressures. The elevated temperatures may improve phosphorus mobility and allow crystalline BP material to form with higher crystalline uniformity at lower pressures. Another factor that may improve the quality of the BP is use of a rigid substrate that has a lower coefficient of thermal expansion than a polymeric substrate and that can withstand high temperatures. The inventor has also realized that it can be beneficial to cover the RP with a stable thin film (such as hBN) to prevent oxidation or degradation of the RP and BP prior to and/or after the application of high pressures. The inventor has surprisingly found that covering the RP with a thin film (as thin as 10 nm) of hBN and applying elevated temperatures during the application of very high pressures can produce highly-uniform crystalline BP thin films with atomically sharp interfaces between the hBN and BP layers.

Figure 5A:
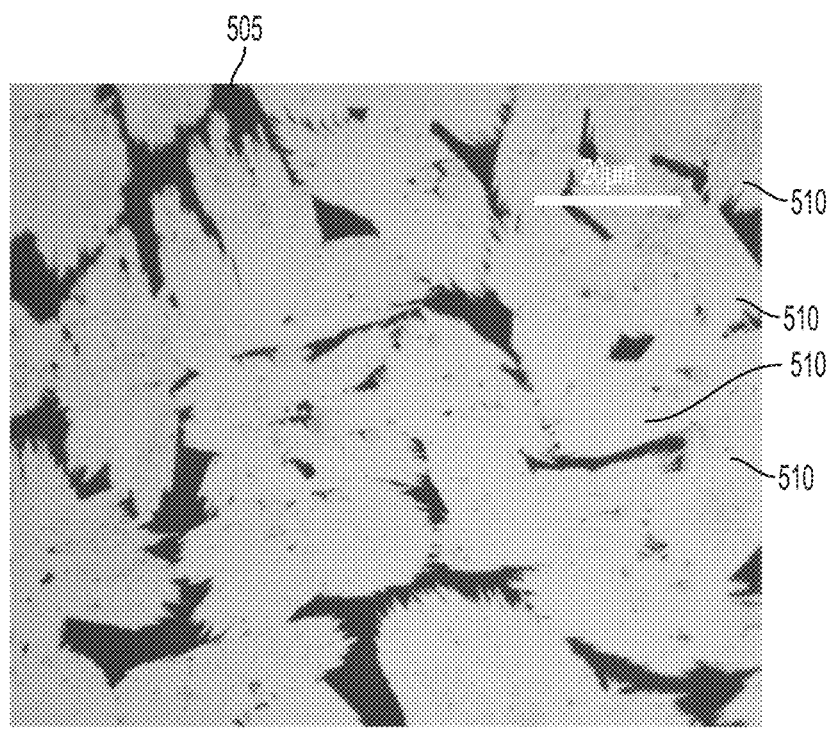
FIG. 5A is an optical microscope image showing regions of BP (light shade) crystallized on and covering a majority of a surface of a sapphire substrate (dark color).

FIG. 5A-FIG. 7 show results from forming BP thin films on high-temperature substrates where high temperatures and high pressures were applied during conversion of a RP thin film to BP. For the examples shown in these figures, a hBN cap layer was used to cover a RP film prior to conversion of the RP film to BP. FIG. 5A is a microscope image showing flakes 510 of BP (light color) on a sapphire substrate 505 (dark color). The BP flakes 510 were converted from a thin film of RP (approximately 30 nm thick) deposited on the sapphire substrate 505 using a high temperature and high pressure method, as described above. The measured thickness of the BP flakes was about 20 nm. For this sample, the temperature was increased to about 700° C. and the pressure was increased to about 1.5 GPa. The resulting BP flakes 510 have a highly uniform crystallinity throughout their height or thickness and width (as indicated by FIG. 5B). The size of the flakes 510 are on the order of 10's of microns, and the flakes may cover more than 75% of the substrate's surface. In some implementations, the flakes 510 cover more than 95% of the substrate's surface.

Figure 12:
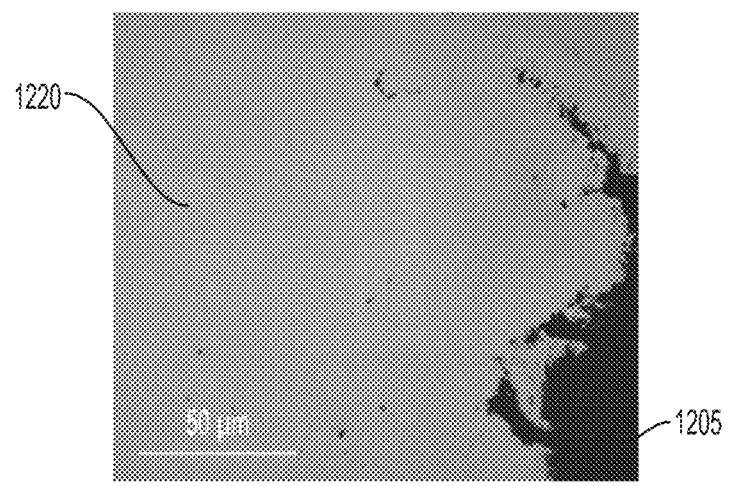
FIG. 12 is an optical microscope image showing a large region of BP (light shade) crystallized on and covering a majority of a surface of a sapphire substrate (dark color).

Another example of a large-area BP film 1220 capped with hBN on a sapphire substrate 1205 is shown in FIG. 12. For this sample, the temperature was increased to about 700° C. and the pressure was increased to about 1.5 GPa and held for approximately 4 hours to convert a hBN-capped RP film to a hBN-capped BP film 1220. Pressure was applied with a Boyd-England piston cylinder. A thickness of the RP layer was approximately 80 nm before conversion, though the thickness varied between 50 nm and 100 nm due to the roughness of the RP layer. The converted BP film was measured to be approximately 50 nm thick. The hBN capping layer, where deposited, was between approximately 5 nm and 10 nm thick, though other thicknesses can be used. According to some embodiments, the hBN capping layer can be deposited by transferring an exfoliated hBN thin film using a stamping process, as described in C. Li et al., "Synthesis of Crystalline Black Phosphorus Thin Film on Sapphire," *Advanced Materials*, 1703748 30(6), January 2018, which is incorporated by reference in its entirety. The sample in FIG. 12 shows improved coverage continuity, but also exhibits surface ripples within crystal grains. Continuous films of BP extending up to 600 microns across the substrate 1205 can be obtained. Additionally, single grain sizes spanning as much as 100 microns across a surface of the substrate can be obtained according to the exemplary process. Larger grain sizes may be obtained under different temperatures, pressure, and holding times. In some embodiments, single grain sizes produced according to the exemplary methods span a minimum of 2 microns across a surface of the substrate 1205. Further, the BP film 1220 may cover at least 75% of a process surface of the substrate 1205, with substrate sizes of at least 2 mm in diameter. In some embodiments, the coverage by the BP film can be as high as 95% or even greater than 95% of a process surface of the substrate 1205, with substrate sizes of at least 2 mm in diameter. In some cases, such coverage by the BP film 1220 can be obtained on other substrate sizes described herein.

Figure 13:
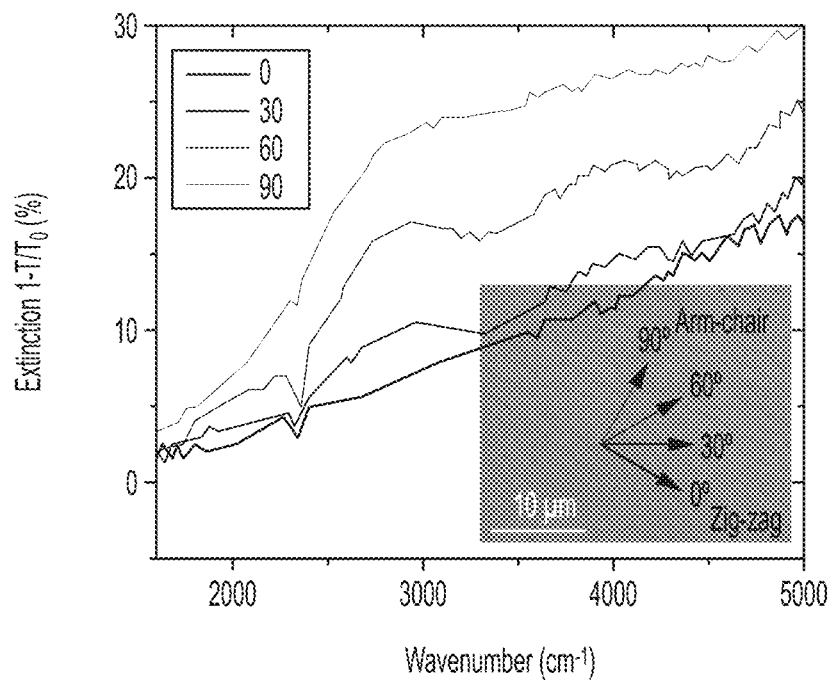
FIG. 13 plots polarization-resolved optical extinction spectra for a thin BP film formed on a sapphire substrate. An optical microscope image of a region of a BP film and polarization orientations of the infrared excitation are shown in the inset.

Infrared extinction measurements for the sample shown in FIG. 12 are shown in FIG. 13 for four different polarization orientations of the infrared excitation. For the 0° orientation (shown in the inset), the polarization was aligned with the ridges and troughs of ripples in the BP film. The results of FIG. 13 indicate that the ridges and troughs of ripples in the BP film are aligned with the armchair direction of the BP crystal.

Figure 5B:
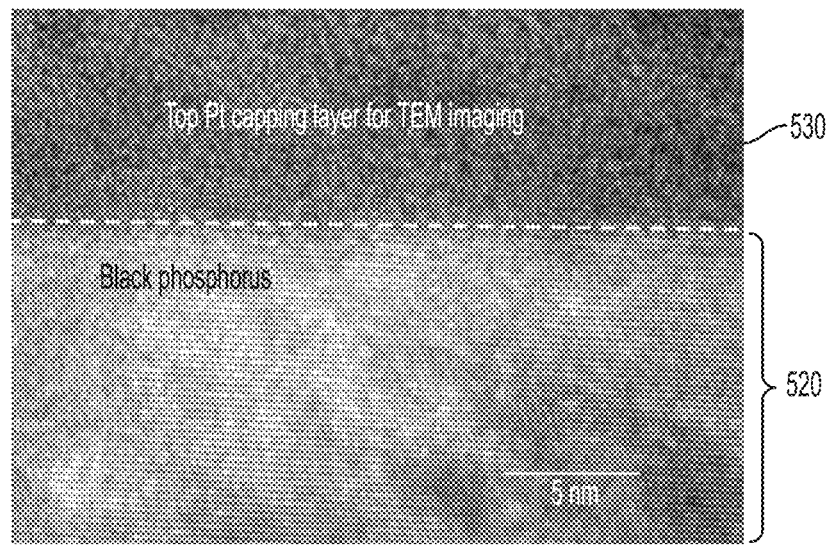
FIG. 5B is a transmission electron microscope (TEM) image of black phosphorus formed on a sapphire substrate using elevated temperatures and high pressures.

FIG. 5B shows the crystalline structure of the BP flakes 510. TEM images of the sample show highly-uniform atomic layers of phosphorus throughout the height of the formed BP layer 520. A platinum capping 530 was applied over the BP layer 520 to aid in sample preparation and TEM imaging. For this sample, the BP layer 520 was about 30 nm thick. The highly-uniform crystal extends throughout the flakes 510 laterally across the surface of the sapphire substrate 505. The heating and deposition on sapphire results in a significantly-improved BP thin film (e.g., as compared with FIG. 4B) that can be formed at lower pressures.

Figure 6A:
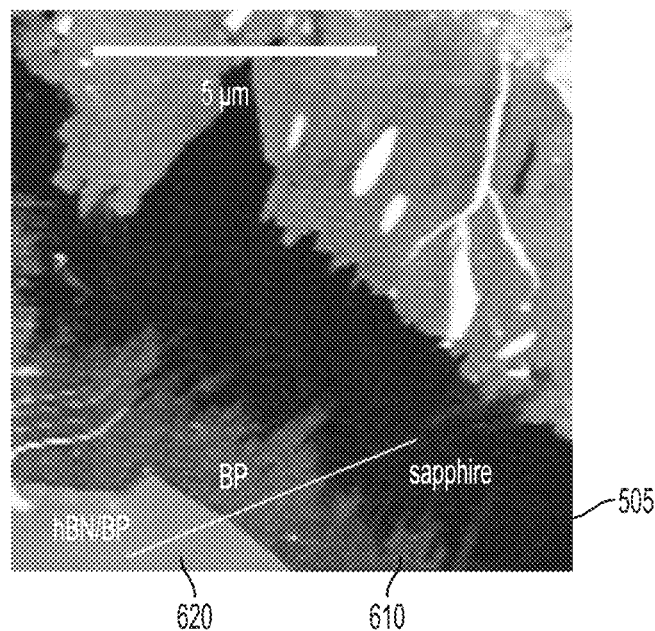
FIG. 6A is a two-dimensional atomic force microscope (AFM) scan of a surface of a small region of a sapphire substrate covered with BP and capped with hBN. The shading indicates height of the formed layers above the sapphire surface. Greater heights above the dark sapphire surface are indicated with lighter shading.

The inventor has also applied a thin film (~10 nm thick) of hexagonal boron nitride over RP before conversion of the RP film to BP, as described above. For example, after depositing a thin film of RP on a sapphire substrate, a thin previously-formed film of hBN (or other dielectric material) can be transferred onto the RP film. The substrate may then be heated (up to about 1000° C.) and subjected to high pressures (up to about 10 GPa). FIG. 6A is a two-dimensional atomic force microscope (AFM) image formed from a topographical scan of a small region of a sample's surface that was prepared with a hBN film. The dark region in the image corresponds to the surface of a sapphire substrate 505. The lighter shades correspond to higher features on a bilayer film that comprises a BP film 610 (~15 nm thick) covered by a thin layer of hBN 620 (~10 nm thick). An intermediate region between the sapphire surface and hBN/BP bilayer has an uncovered portion of BP film 610.

Figure 6B:
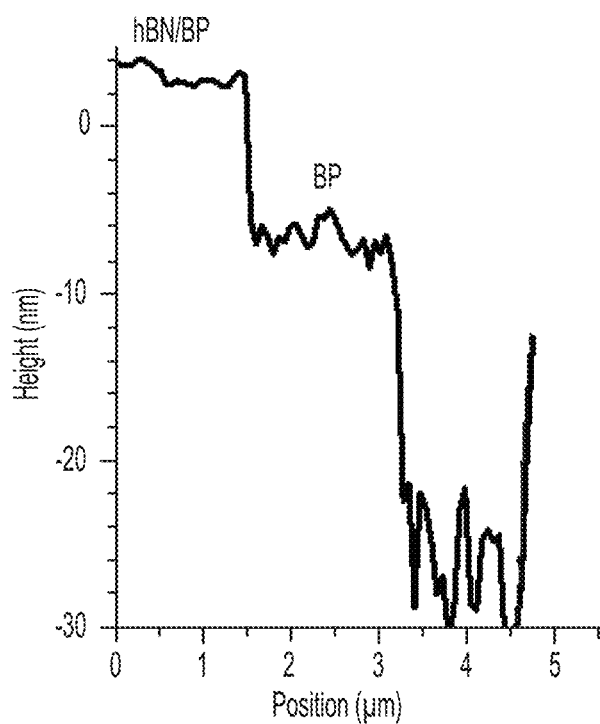
FIG. 6B is a one-dimensional AFM scan corresponding to the white line at the bottom of FIG. 6A, and shows smooth surfaces of the hBN capping layer and BP.

A one-dimensional scan (plotted in FIG. 6B) along a direction indicated by the white line at the bottom of FIG. 6A shows the surface profile of the sample. The surfaces of the BP and hBN are atomically smooth along the trace. Although the surface of the sapphire is optically polished prior to depositions, its rough appearance in FIG. 6B is believed to be due to residual BP or hBN on the sapphire surface between the larger flakes of BP.

Figure 6C:
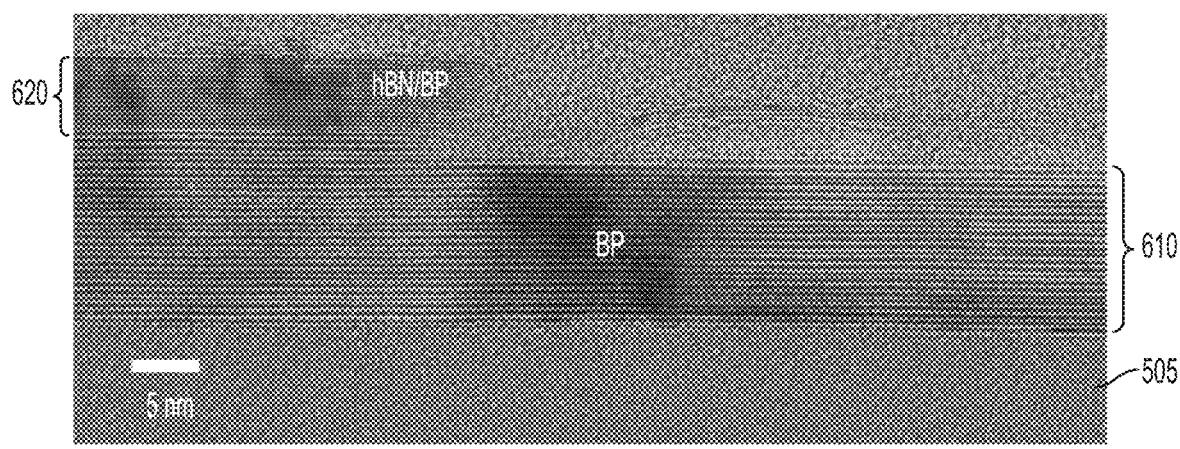
FIG. 6C is a TEM image of a sample showing a high-quality crystalline film of BP formed on a sapphire substrate and partially covered by a high-quality crystalline film of hBN.
Figure 6D:
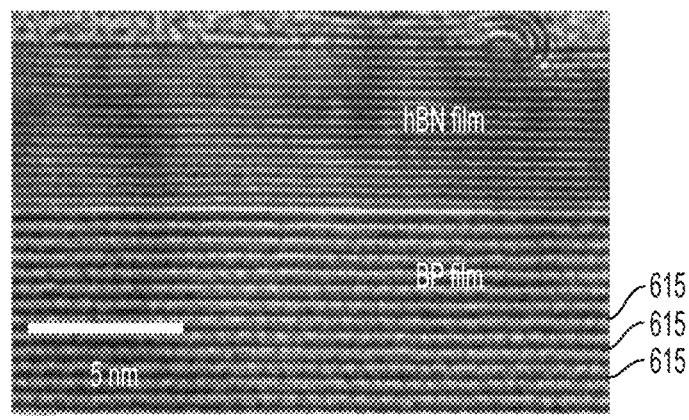
FIG. 6D is a TEM image of a region of the sample shown in FIG. 6C and shows an atomically sharp interface between the hBN and BP with no defects along the interface.

FIG. 6C and FIG. 6D are TEM cross-section images showing the high uniformity of both the BP film 610 and hBN film 620 formed on the sapphire substrate 505, according to the present embodiments. FIG. 6D is a close-up of a region of FIG. 6C. As can be seen, the crystalline lattice structures 615 are highly uniform throughout the observed regions, and no defects such as stacking faults are present. In some cases, regions of BP material free of defects or having fewer than 5 defects may span at least two microns across a surface of the substrate and as much as 100 microns. Surprisingly, the interface between the hBN and BP is atomically sharp and also free of defects, such as stacking faults. In some embodiments, a low defect density in the BP thin films 610 (e.g., less than 100 nm thick) formed using high temperatures and high pressures is between 10 cm$^{-2}$ and 100 cm$^{-2}$. In some cases, the low defect density is between 1 cm$^{-2}$ and 10 cm$^{-2}$. The size of an area having a low defect density may be between 100 μm$^2$ and 10 cm$^2$, in some cases. In other cases, larger areas may be obtained having such a low defect density.

Figure 7:
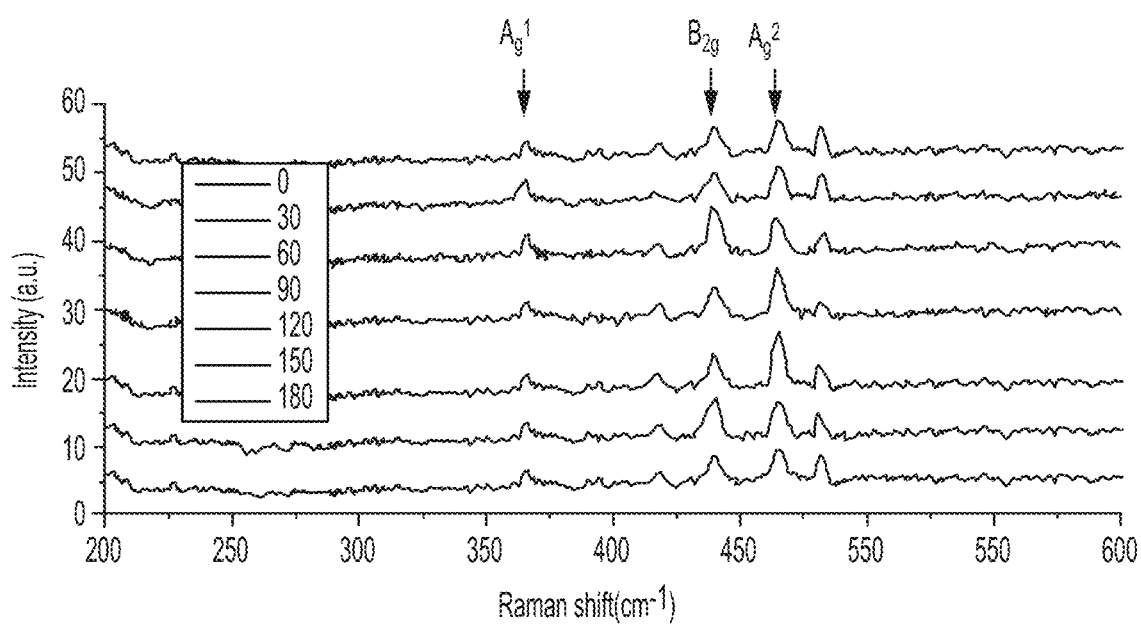
FIG. 7 plots results from polarized Raman spectroscopy measurements of hBN/BP films formed on a sapphire substrate, and shows polarization dependence of the Raman signal.
Figure 14:
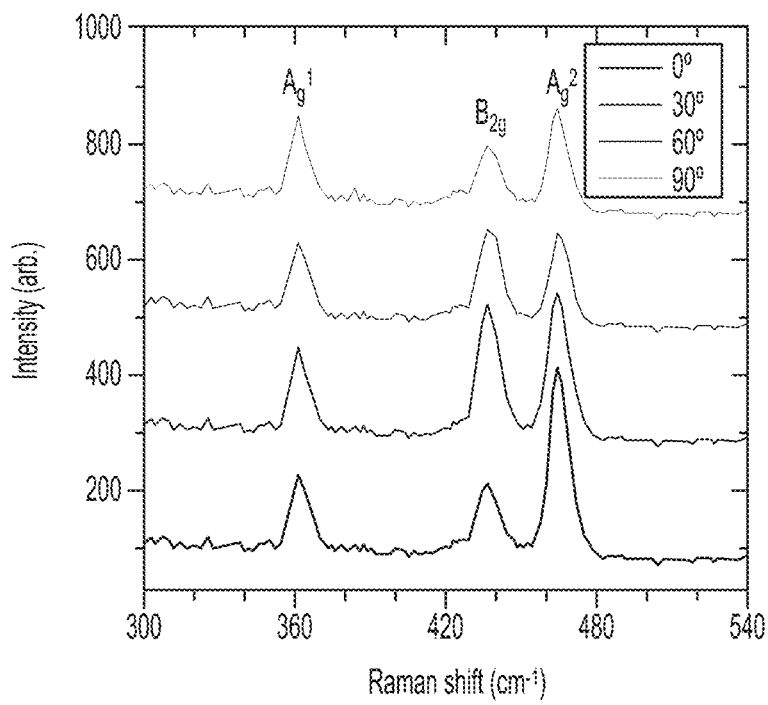
FIG. 14 plots results from polarized Raman spectroscopy measurements of hBN/BP films formed on a sapphire substrate, and shows polarization dependence of the Raman signal.

Raman spectra for hBN/BP/sapphire samples are shown in FIG. 7 and FIG. 14, and show distinctive peaks at 360 cm$^{-1}$, 435 cm$^{-1}$, and 463 cm$^{-1}$ that indicate the formation of BP. The spectra shown in FIG. 7 corresponds to the sample described in FIG. 5A and FIG. 6C. The spectra shown in FIG. 14 corresponds to the sample described in FIG. 12. The spectra are recorded using linearly polarized light for several different orientations with respect to a crystal axis of the BP. The trace oriented at 0 degrees corresponds to the bottom trace in the graph. The orientation angle increases to 180 degrees (highest trace). The spectra show strong polarization-dependent intensity of the Raman signal.

Although only one capping layer and one RP material film are described in the above embodiments, it is possible to include additional layers of RP material film and capping layers to form heterostructures or encapsulated BP material films. For example, a first hBN film may be formed on a substrate 105 (e.g., sapphire). The hBN film can be subsequently covered with RP material, as described above. A second hBN film may then be transferred onto the RP material prior to conversion of the RP material to BP material. The resulting heterostructure may comprise hBN/BP/hBN layers on a substrate in which the BP material is encapsulated. Additional layers may be added prior to or after conversion of one or more layers of RP material. Also, more than two types of materials may be used in the heterostructure stack.

Figure 8:
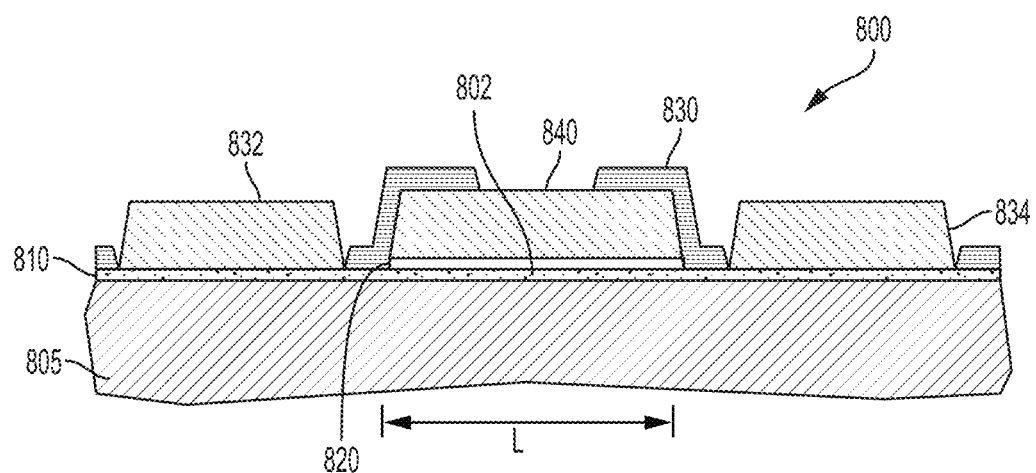
FIG. 8 depicts a thin-film BP material field-effect transistor, according to some embodiments.

Thin-film transistors may be formed from BP material film, according to some embodiments. FIG. 8 depicts an embodiment of a field-effect transistor 800 having a top gate that may be formed incorporating a BP material film as a controllable conductive channel 802 between a source contact 832 and drain contact 834. In some embodiments, a thin film of BP material 810 may be formed on a substrate 805, using a method as described above. The substrate 805 may comprise sapphire in some cases, or may comprise a semiconductor substrate (bulk or including one or more layers) in other cases. If the substrate 805 is formed from a semiconductor, there may be a thin insulating layer (not shown in FIG. 8) between the substrate 805 and the film of BP material 810. A thickness of the BP material 810 may be between 5 nm and 50 nm.

According to some embodiments, a thin gate insulating layer 820 (e.g., hBN or other dielectric insulator) may be formed over the BP material film. In the case of hBN, a hBN film used when forming the BP material under pressure, as described above, can also be used as the gate insulating layer 820. In some implementations, the insulating layer 820 may be formed only in a gate region (e.g., by application of strips of the insulating layer, deposition through a mask, or lithographic patterning). In some cases, the insulating layer may be patterned after deposition to form a gate insulator 820. In some embodiments, a thin gate insulator 820 and a gate contact 840 may be deposited and subsequently patterned simultaneously to form a self-aligned, insulated gate contact. The size of the gate contact 840 determines the size of a controllable current-carrying channel below the gate contact. The gate contact 840 and corresponding channel 802 may have any suitable size. For example, a width of the channel (a dimension extending into the page of the drawing) may be between 1 micron and 1 millimeter. A length L of the channel may be between 50 nm and 50 microns. According to some embodiments, a passivating layer 830 may be formed over the gate contact and subsequently patterned to open regions for a source contact 832 and a drain contact 834. Alternatively, source and drain contacts may be patterned using a shadow mask. In operation, the drain contact may be biased with a voltage V$_d$, and a voltage applied to the gate contact V$_g$ may control current flow along the BP material channel 802 between the drain contact 834 and source contact 832. Example materials for the gate, source, and drain contacts include, but are not limited to, Au/Cr, Au/Ti, Au/Cr/Ti multilayer stacks.

Figure 15:
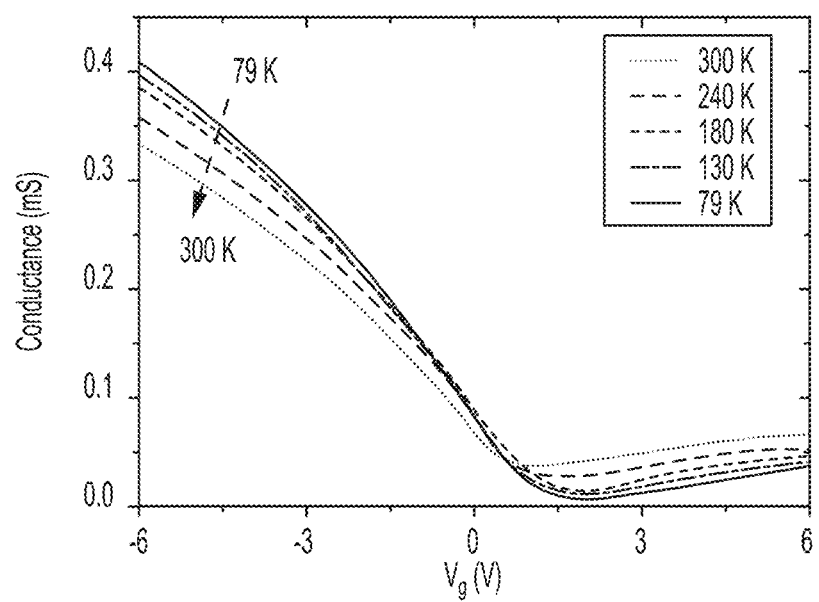
FIG. 15 plots measured conductance along a BP FET channel as a function of gate bias and temperature.

A FET having a top-gate structure like that shown in FIG. 8 and BP channel (approximately 50 nm thick) formed according to the methods described above was fabricated on a sapphire substrate. The FET's gate insulating layer 820 was a 20-nm thick Al$_2$O$_3$ layer deposited by atomic layer deposition. The FET was formed within an area of a single BP grain, and the conduction direction along the FET channel 802 was aligned along the armchair direction of the BP crystal. To measure channel conductance and transport properties, a Hall-bar structure was formed that included four voltage probes contacting different regions of the FET's BP channel. Results of channel conductance measurements as a function of device temperature and gate bias are plotted in FIG. 15. Based on the measured conductances and properties of the gate insulator measured separately (as described in C. Li et al., "Synthesis of Crystalline Black Phosphorus Thin Film on Sapphire," *Advanced Materials*, 1703748 30(6), January 2018), room temperature, field-effect mobility for the BP film formed on sapphire was found to be approximately 160 cm$^2$ V$^{-1}$ s$^{-1}$. Since BP is capable of electron or hole mobilities in excess of 10,000 cm$^2$ V$^{-1}$ s$^{-1}$, mobilities in highly-uniform BP material conductive films of transistors may be as high as 10,000 cm$^2$ V$^{-1}$ s$^{-1}$.

Figure 9:
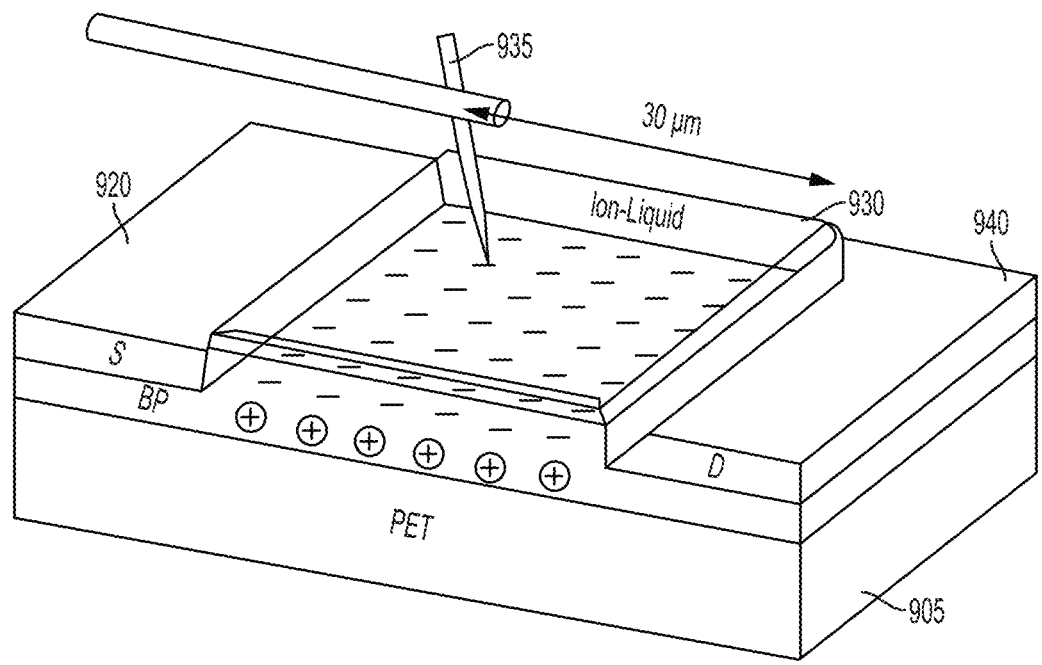
FIG. 9 depicts a BP material field-effect transistor that uses an ionic liquid to form a gate of the transistor, according to some embodiments.

Another approach to forming a field-effect transistor is depicted in FIG. 9. The device illustrated in FIG. 9 may be fabricated directly on a flexible PET substrate 905 and used to characterize transport properties of the BP film. Source S electrode 920 and drain D electrode 940 may be deposited directly on the BP film using a shadow mask. According to one embodiment, the transistor channel length and width are 30 μm and 70 μm, respectively, though other dimensions may be used. After metallization, an electrochemical gate 930 may be formed using ionic liquid (e.g., 0.1 mol/L LiClO$_4$ aqueous solution). A gold wire 935 may be inserted into the ionic liquid to electrically connect to the gate.

Figure 10:
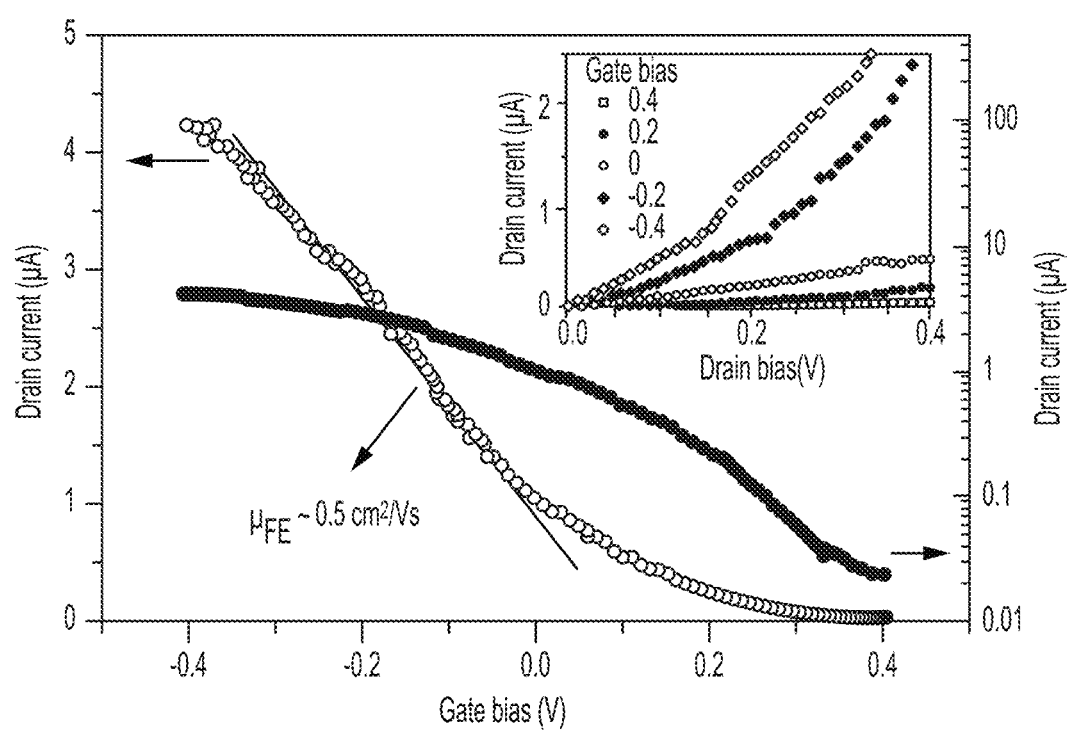
FIG. 10 plots current transfer characteristics (linear and log scales) of a transistor made from thin-film BP formed on a PET substrate, as depicted in FIG. 9. The quality of the BP formed on the PET substrate was significantly less than the quality of the BP formed on the sapphire substrate. The inset shows output characteristics for the same transistor.

Transfer characteristics for the FET depicted in FIG. 9 (at 0.25 V source-drain bias) are plotted in FIG. 10. The amount of drain current flowing between the drain and source is plotted, in both linear and log scales, as a function of gate bias. The control of current flow indicates that the converted BP has p-type conductivity. The transistor's on/off ratio is around 200.

The field-effect mobility of carriers (holes) in the linear region of current control can be estimated using the following expression $$\mu = \frac{L}{W} \frac{1}{C_i} \frac{\partial g_{ds}}{\partial V_g}$$

where L and W are length and width of the transistor's channel, respectively, $g_{ds}$ is the conductance measured between the source and drain, $C_i$ is the capacitance of the ionic liquid gate, and $V_g$ is the gate bias. The $C_i$ is estimated to be around 15 g/cm² for the gate size and materials described above for the device depicted in FIG. 9. The hole mobility is calculated to be 0.5 cm² V⁻¹ s⁻¹ using the parameters in the expression above. This mobility is lower than that in exfoliated flakes, because the sample used was polycrystalline and had small randomly oriented BP grain sizes (depicted in FIG. 4B).

Although the sample substrates depicted above are between 4 millimeters and 5 millimeters in diameter, the embodiments described herein are scalable to allow production of large-area BP material films. In some implementations, the substrates may be stacked and converted in one pressure run, provided the stack of substrates fit in an anvil or press. In some implementations, the substrate size may be increased for RP material film deposition by scaling up the size of the deposition chamber. Increasing temperatures during the application of high pressures can allow a reduction in pressure and larger substrate sizes. Although generating high pressure beyond 8 GPa over a large area may be challenging, at temperatures higher than 700° C. and long hold durations, pressures needed for phase transition to BP material may be as low as 0.2 GPa or lower. In some implementations, RP material films may be deposited on a silicon or other semiconductor substrates, and then the phase transition from RP material to BP material may be accomplished by immersing the substrate in liquid and applying hydrostatic pressure. In some embodiments, if an inert substrate which can sustain a high temperature beyond the melting point of BP (>900° C.) is used during the conversion process, wafer-scale crystalline thin-film black phosphorus material may be realized.

A wafer, device, or structure comprising capped or encapsulated black phosphorus material can be embodied in different configurations. Example configurations include combinations of configurations (1) through (17) as described below.

(1) A wafer comprising a substrate; a layer of black phosphorous material formed over a first area of the substrate; and a layer of dielectric material formed over the black phosphorous material in the first area, wherein a first interface between the black phosphorous material and the dielectric material extending for as much as one micron across the first area has fewer than 5 stacking faults.

(2) The wafer of configuration (1), wherein the layer of black phosphorous material covers at least 75% of a surface of the substrate.

(3) The wafer of configuration (1) or (2), wherein the layer of black phosphorous material has regions of continuous coverage as large as 600 microns across a surface of the substrate.

(4) The wafer of any one of configurations (1)-(3), wherein the first area comprises a single crystal grain and has a minimum span across a surface of the substrate of 2 microns.

(5) The wafer of any one of configurations (1)-(3), wherein the first area comprises a single crystal grain and has a span across a surface of the substrate as large as 100 microns.

(6) The wafer of any one of configurations (1)-(5), wherein the dielectric material comprises hexagonal boron nitride or silicon nitride.

(7) The wafer of any one of configurations (1)-(6), wherein the black phosphorus material is uniformly crystalline throughout its thickness.

(8) The wafer of any one of configurations (1)-(5), wherein the dielectric material comprises aluminum oxide or hafnium oxide.

(9) The wafer of any one of configurations (1)-(8), wherein the black phosphorous material is uniformly crystalline from the first interface to a second interface between the crystalline black phosphorous material and the substrate.

(10) The wafer of any one of configurations (1)-(9), wherein a thickness of the black phosphorous material is between two atomic layers and 100 nanometers.

(11) The wafer of any one of configurations (1)-(3) or (5)-(10), wherein the first area comprises a single crystal grain and has a minimum span across a surface of the substrate of 2 microns.

(12) The wafer of any one of configurations (1)-(11), wherein a defect density in atomic layers of the black phosphorous material is between 10 cm⁻² and 100 cm⁻².

(13) The wafer of any one of configurations (1)-(12), wherein the black phosphorus material exhibits electron or hole mobilities as much as 170 cm² V⁻¹ s⁻¹.

(14) The wafer of any one of configurations (1)-(13), further comprising a drain electrode formed in electrical contact with the black phosphorous material at a first location within the first area; a source electrode formed in electrical contact with the black phosphorous material at a second location within the first area; and a gate electrode formed between the drain electrode and the source electrode for controlling current flow between the drain electrode and the source electrode.

(15) The wafer of any one of configurations (1)-(14), wherein the layer of black phosphorous material exhibits electron and hole mobilities between 100 cm² V⁻¹ s⁻¹ and 10,000 cm² V⁻¹ S⁻¹.

(16) The wafer of any one of configurations (1)-(15), further comprising at least one additional layer of dielectric material or black phosphorous material formed over the first area to form a heterostructure stack of at least three layers.

(17) The wafer of configuration (16), wherein the heterostructure stack comprises hBN/BP/hBN where hBN represents a film of hexagonal boron nitride and BP represents a film of black phosphorus material.

Methods for making capped or encapsulated black phosphorus material can include various processes. Example methods include combinations of processes (18) through (25) as described below. These processes may be used, at least in part, to make capped or encapsulated black phosphorus material of the configurations listed above.

(18) A process for forming black phosphorous material on a substrate, the process comprising depositing a layer of red phosphorous material on the substrate; depositing a dielectric material over the red phosphorous material; and heating the substrate, the layer of red phosphorous material, and the dielectric material at temperatures up to 500 degrees Celsius under elevated pressure.

(19) The process of (18), wherein the elevated pressure is between 0.2×10⁹ Pascals and 7×10⁹ Pascals.

(20) The process of (18) or (19), further comprising heating the substrate, the layer of red phosphorous material, and the dielectric material at temperatures up to 1000 degrees Celsius under the elevated pressure.

(21) The process of any one of (18)-(20), wherein depositing the layer of red phosphorous material comprises thermal deposition of the red phosphorous material on the substrate in vacuum.

(22) The process of any one of (18)-(21), wherein depositing the dielectric material comprises transferring a film of hexagonal boron nitride onto a surface of the layer of red phosphorous material.

(23) The process of any one of (18)-(21), wherein depositing the dielectric material comprises depositing the dielectric material by atomic layer deposition.

(24) The process of any one of (18)-(23), wherein the dielectric material has a thickness between 2 nanometers and 50 nanometers.

(25) The process of any one of (18)-(24), further comprising depositing a first layer of dielectric material on the substrate prior to depositing the layer of red phosphorus material, so that the layer of red phosphorus material is encapsulated by dielectric material.

The terms "approximately" and "about" are used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension. The term "essentially" is used to mean within ±3% of a target dimension.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings typically depict a small portion of a BP material layer, it will be appreciated that a large area or entire substrate may be covered with such a layer. Further, the layer may be patterned or subject to microfabrication processes so that integrated-circuit devices (e.g., transistors, diodes, thyristors, light-emitting diodes, laser diodes, photodiodes and the like) may be fabricated using the BP material. In some embodiments, the integrated-circuit devices may be used in consumer electronic devices such as smart phones, tablets, PDA's, computers, televisions, sensors, lighting, displays, as well as application-specific integrated circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A wafer comprising:
a substrate;
a layer of crystalline black phosphorous material formed over a first area of the substrate; and
a layer of dielectric material formed over the black phosphorous material in the first area, wherein a first interface between the black phosphorous material and the dielectric material extending for as much as one micron across the first area has fewer than 5 stacking faults in the black phosphorous material, wherein the layer of black phosphorous material covers at least 75% of a surface of the substrate.

2. The wafer of claim 1, wherein the layer of black phosphorous material has regions of continuous coverage as large as 600 microns across a surface of the substrate.

3. The wafer of claim 1, wherein the first area comprises a single crystal grain and has a minimum span across a surface of the substrate of 2 microns.

4. The wafer of claim 1, wherein the first area comprises a single crystal grain and has a span across a surface of the substrate as large as 100 microns.

5. The wafer of claim 1, wherein the dielectric material comprises hexagonal boron nitride or silicon nitride.

6. The wafer of claim 5, wherein the black phosphorus material is uniformly crystalline throughout its thickness.

7. The wafer of claim 1, wherein the dielectric material comprises aluminum oxide or hafnium oxide.

8. The wafer of claim 1, wherein the black phosphorous material is uniformly crystalline from the first interface to a second interface between the crystalline black phosphorous material and the substrate.

9. The wafer of claim 8, wherein a thickness of the black phosphorous material is between two atomic layers and 100 nanometers.

10. The wafer of claim 8, wherein the first area comprises a single crystal grain and has a minimum span across a surface of the substrate of 2 microns.

11. The wafer of claim 10, wherein a defect density in atomic layers of the black phosphorous material is between 10 $cm^{-2}$ and 100 $cm^{-2}$.

12. The wafer of claim 1, wherein the black phosphorous material exhibits electron or hole mobilities as much as 170 $cm^2 V^4 s^{-1}$.

13. The wafer of claim 1, further comprising:
a drain electrode formed in electrical contact with the black phosphorous material at a first location within the first area;
a source electrode formed in electrical contact with the black phosphorous material at a second location within the first area; and
a gate electrode formed between the drain electrode and the source electrode for controlling current flow between the drain electrode and the source electrode.

14. The wafer of claim 1, wherein the layer of black phosphorous material exhibits electron and hole mobilities between 100 $cm^2 V^{-1} s^{-1}$ and 10,000 $cm^2 V^{-1} s^{-1}$.

15. The wafer of claim 1, further comprising at least one additional layer of dielectric material or black phosphorous material formed over the first area to form a heterostructure stack of at least three layers.

16. The wafer of claim 15, wherein the heterostructure stack comprises hBN/BP/hBN where hBN represents a film of hexagonal boron nitride and BP represents a film of black phosphorus material.

17. A wafer comprising:
a substrate;
a layer of crystalline black phosphorous material formed over a first area of the substrate; and
a layer of dielectric material formed over the black phosphorous material in the first area, wherein a first interface between the black phosphorous material and the dielectric material extending for as much as one micron across the first area has fewer than 5 stacking faults in the black phosphorous material, wherein the first area comprises a single crystal grain and has a span across a surface of the substrate as large as 100 microns.

18. The wafer of claim 17, wherein the dielectric material comprises hexagonal boron nitride or silicon nitride.

19. The wafer of claim 17, wherein a thickness of the black phosphorous material is between two atomic layers and 100 nanometers.

20. The wafer of claim 17, further comprising at least one additional layer of dielectric material or black phosphorous material formed over the first area to form a heterostructure stack of at least three layers.

21. A wafer comprising:
a substrate;
a first layer of crystalline black phosphorous material formed over a first area of the substrate;
a layer of first dielectric material formed over the black phosphorous material in the first area, wherein a first interface between the black phosphorous material and the first dielectric material extending for as much as one micron across the first area has fewer than 5 stacking faults in the black phosphorus material; and
at least one additional layer of dielectric material or black phosphorous material formed over the first area to form a heterostructure stack of at least three layers.

22. The wafer of claim 21, wherein the first dielectric material comprises hexagonal boron nitride or silicon nitride.

23. The wafer of claim 21, wherein the first layer of black phosphorous material has regions of continuous coverage as large as 600 microns across a surface of the substrate.

24. The wafer of claim 23, wherein a thickness of the black phosphorous material is between two atomic layers and 100 nanometers.

25. The wafer of claim 21, wherein the first layer of black phosphorous material exhibits electron and hole mobilities between 100 $cm^2$ $V^{-1}$ $s^{-1}$ and 10,000 $cm^2$ $V^{-1}$ $s^{-1}$.

* * * * *